(12) United States Patent  
Chang

(10) Patent No.: US 12,512,422 B2
(45) Date of Patent: Dec. 30, 2025

(54) SEMICONDUCTOR DEVICES HAVING AN ELECTRO-STATIC DISCHARGE PROTECTION STRUCTURE

(71) Applicant: Taiwan Semiconductor Manufacturing Company Limited, Hsinchu (TW)

(72) Inventor: Yi-Feng Chang, Xinbei (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

(21) Appl. No.: 18/319,575

(22) Filed: May 18, 2023

(65) Prior Publication Data
US 2023/0290745 A1 Sep. 14, 2023

Related U.S. Application Data

(60) Division of application No. 16/985,371, filed on Aug. 5, 2020, now Pat. No. 11,688,702, which is a continuation of application No. 16/945,988, filed on Aug. 3, 2020, now Pat. No. 11,688,701, which is a division of application No. 14/609,498, filed on Jan. 30, 2015, now Pat. No. 10,734,330.

(51) Int. Cl.
*H01L 23/60* (2006.01)
*H01L 23/482* (2006.01)
*H01L 21/02* (2006.01)
*H01L 23/522* (2006.01)
*H10D 89/60* (2025.01)

(52) U.S. Cl.
CPC .......... *H01L 23/60* (2013.01); *H01L 23/4824* (2013.01); *H01L 21/02697* (2013.01); *H01L 23/522* (2013.01); *H10D 89/60* (2025.01)

(58) Field of Classification Search
CPC ................. H01L 23/60; H01L 23/4824; H01L 21/02697; H01L 23/522; H01L 27/0248
USPC .......................................................... 257/773
See application file for complete search history.

(56) References Cited

U.S. PATENT DOCUMENTS

| | | | |
|---|---|---|---|
| 5,554,867 A | 9/1996 | Ajika et al. | |
| 5,597,758 A * | 1/1997 | Heim | H01L 27/0255 257/E29.328 |
| 2006/0024905 A1 | 2/2006 | He et al. | |
| 2006/0208962 A1 | 9/2006 | Sekiya | |
| 2006/0289994 A1 | 12/2006 | Greenberg et al. | |
| 2007/0075350 A1 | 4/2007 | Darabi et al. | |

(Continued)

OTHER PUBLICATIONS

Abu-Abed, A.S., Lindquist, R.G.; Capacitive Interdigital Sensor with Inhomogeneous Nematic Liquid Crystal Film; Progress in Electromagnetics Research B, vol. 7; pp. 75-87, 2008.

*Primary Examiner* — Lex H Malsawma
*Assistant Examiner* — Laura M Dykes
(74) *Attorney, Agent, or Firm* — Jones Day

(57) ABSTRACT

A semiconductor device includes a substrate and a metallization layer. The substrate has an active region that includes opposite first and second edges. The metallization layer is disposed above the substrate, and includes a pair of metal lines and a metal plate. The metal lines extend from an outer periphery of the active region into the active region and toward the second edge of the active region. The metal plate interconnects the metal lines and at least a portion of which is disposed at the outer periphery of the active region.

20 Claims, 9 Drawing Sheets

(56) References Cited

U.S. PATENT DOCUMENTS

| | | |
|---|---|---|
| 2007/0102765 A1 | 5/2007 | Tsai et al. |
| 2007/0155090 A1 | 7/2007 | Barth et al. |
| 2007/0228424 A1 | 10/2007 | Igarashi |
| 2008/0023792 A1 | 1/2008 | Liu et al. |
| 2012/0043595 A1 | 2/2012 | Chang et al. |
| 2012/0086683 A1* | 4/2012 | Segura Puchades ........................ H01L 23/5223 345/87 |
| 2012/0146093 A1 | 6/2012 | Shibata et al. |
| 2013/0062625 A1 | 3/2013 | Takada |
| 2013/0334658 A1 | 12/2013 | Cai et al. |
| 2014/0152379 A1 | 6/2014 | Fujimoto et al. |
| 2015/0341000 A1 | 11/2015 | Kanaya |
| 2016/0020200 A1 | 1/2016 | Risaki |
| 2017/0221878 A1* | 8/2017 | Risaki ................. H01L 27/0277 |

\* cited by examiner

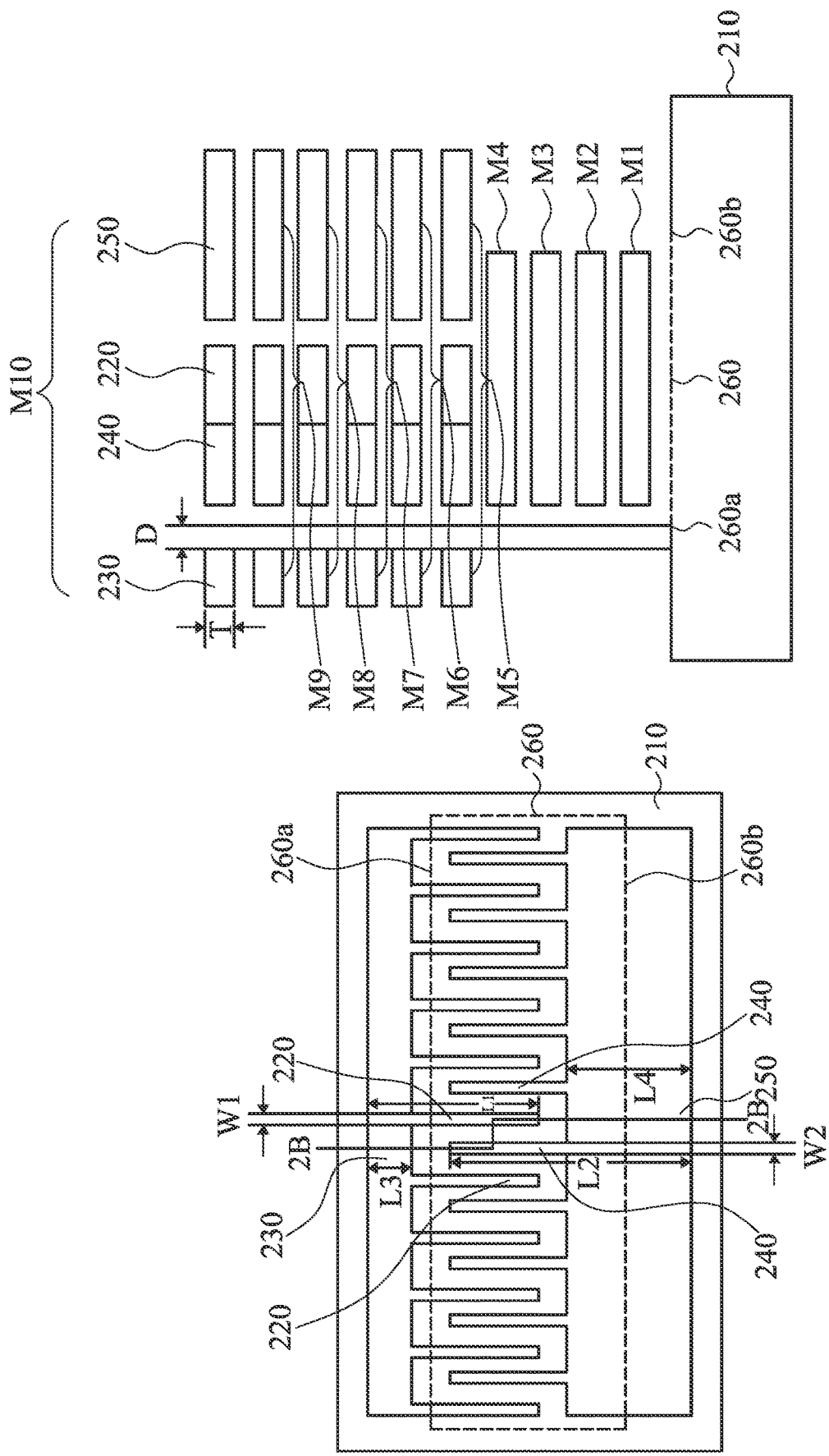

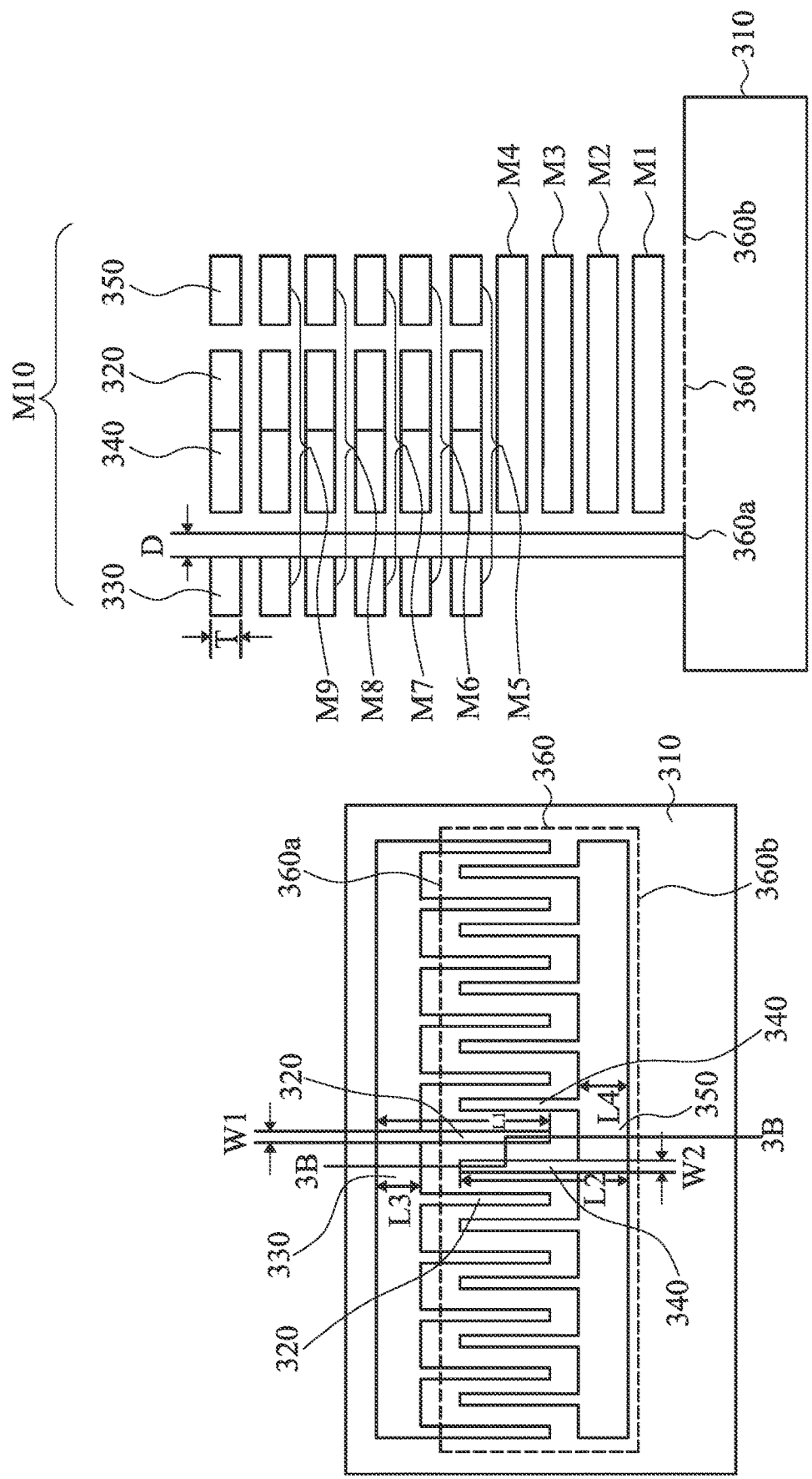

SEMICONDUCTOR DEVICES HAVING AN ELECTRO-STATIC DISCHARGE PROTECTION STRUCTURE

RELATED APPLICATION

This application is a divisional of U.S. patent application Ser. No. 16/985,371, filed on Aug. 5, 2020, which is a continuation of U.S. patent application Ser. No. 16/945,988, filed on Aug. 3, 2020, which is a divisional application of U.S. patent application Ser. No. 14/609,498 filed on Jan. 30, 2015, the contents of each of which are hereby fully incorporated by reference.

BACKGROUND

A conventional semiconductor device includes a substrate, a metallization layer that is disposed above the substrate and that includes horizontal interconnects or vertical interconnects, and a plurality of components, e.g., active components, such as transistors, diodes, etc., and/or passive components, such as resistor, capacitors, and inductors, that are disposed between the substrate and the metallization layer and that are electrically connected by the metallization layer. When an electro-static discharge (ESD) surge occurs, the ESD surge may damage the components of the semiconductor device. It is therefore desirable to provide protection for components of semiconductor devices against ESD surges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic sectional top view of the second exemplary semiconductor device in accordance with some embodiments.

FIG. 2B is a schematic sectional view taken along line 2B-2B of FIG. 2A in accordance with some embodiments.

FIG. 3A is a schematic sectional top view of the third exemplary semiconductor device in accordance with some embodiments.

FIG. 3B is a schematic sectional view taken along line 3B-3B of FIG. 3A in accordance with some embodiments.

DETAILED DESCRIPTION

Figure 1B:
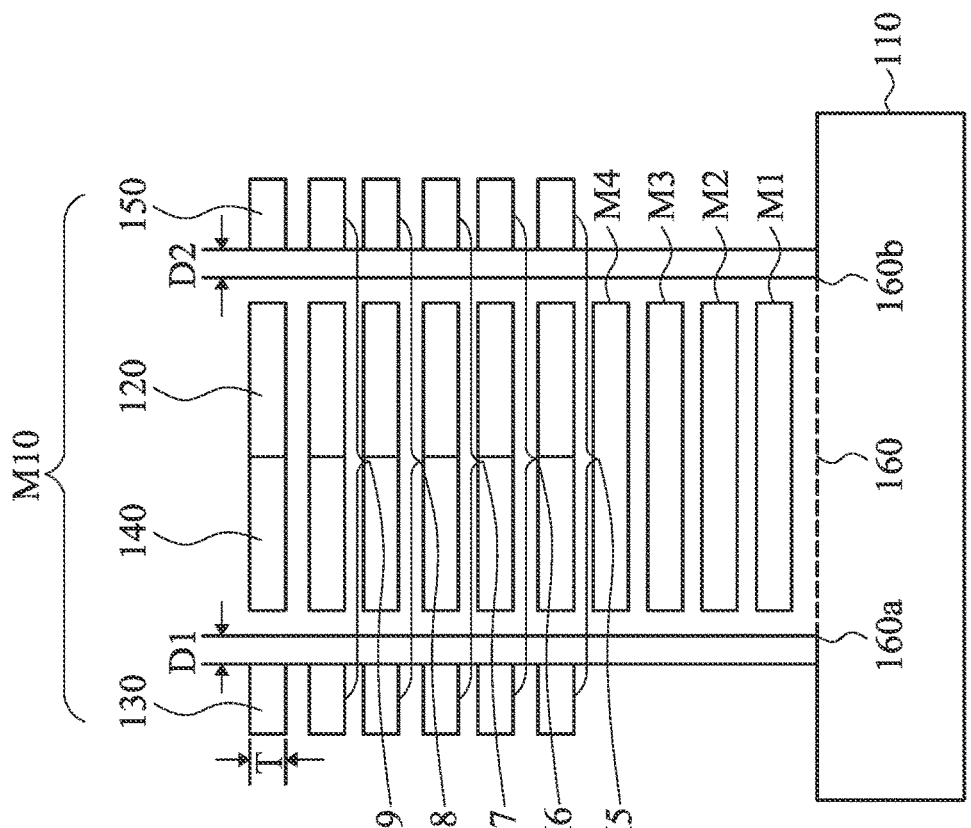
FIG. 1B is a schematic sectional view taken along line 1B-1B of FIG. 1A in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom" and the like, may be used herein for ease of description to describe one element or feature's relationship to another element(s) or feature(s) as illustrated in the figures. The spatially relative terms are intended to encompass different orientations of the structure in use or operation in addition to the orientation depicted in the figures. The apparatus may be otherwise oriented (rotated 90 degrees or at other orientations) and the spatially relative descriptors used herein may likewise be interpreted accordingly.

It is observed that when an ESD surge is applied to a semiconductor device the ESD surge causes a sudden rise in a temperature of the semiconductor device. The present disclosure provides a semiconductor device that includes a metallization layer, the structure of which provides protection for components of the semiconductor device from ESD surges. In an exemplary embodiment, the metallization layer includes a pair of metal lines, and a metal plate that interconnects the metal lines. When an ESD surge occurs, current density of current flowing through the metal lines is distributed over the metal plate, thereby efficiently dissipating heat resulting from the ESD surge, whereby the components of the semiconductor device are protected against the ESD surge.

Figure 1A:
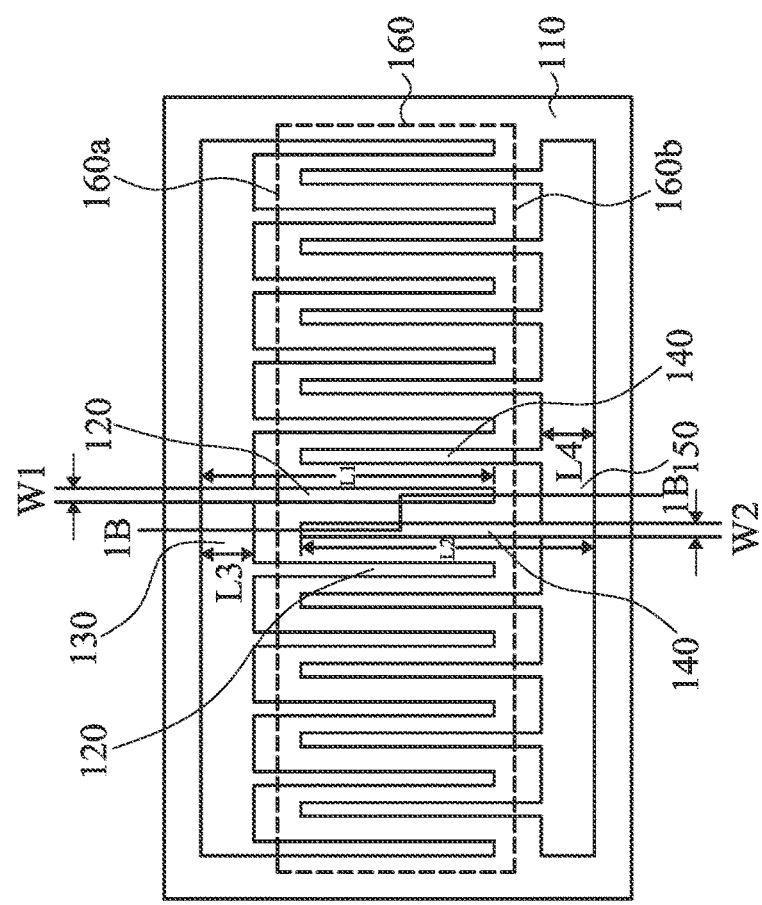
FIG. 1A is a schematic sectional top view of the first exemplary semiconductor device in accordance with some embodiments.

FIG. 1A is a schematic sectional top view of the first exemplary semiconductor device in accordance with some embodiments and FIG. 1B is a schematic sectional view taken along line 1B-1B of FIG. 1A in accordance with some embodiments. As illustrated in FIG. 1B, the semiconductor device includes a substrate 110 and a plurality of metallization layers M5-M10.

The substrate 110 has an active region 160. In an exemplary embodiment, as best shown in FIG. 1A, the active region 160 is generally rectangular, and includes a first edge 160a, and a second edge 160b opposite to the first edge 160a in a direction transverse to a longitudinal direction thereof. Those skilled in the art will appreciate after reading this disclosure that other shapes for the active region are possible.

The metallization layers M5-M10 are disposed sequentially from bottom to top above the substrate 110. Since the constructions of the metallization layers M5-M10 are substantially the same, only the metallization layer M10 will be described hereinafter.

As best shown in FIG. 1A, the metallization layer M10 includes a pair of first metal lines 120, a first metal plate 130, a pair of second metal lines 140, and a second metal plate 150. The first metal lines 120 and the second metal lines 140 are substantially parallel to each other and are arranged alternately along the length of the active region 160.

The first metal lines 120 extend from an outer periphery of the active region 160 into the active region 160 and toward the second edge 160b of the active region 160. The first metal plate 130 cooperates with the first metal lines 120 to form a generally U-shaped cross section, interconnects sidewalls of the first metal lines 120, and is disposed at the outer periphery of the active region 160. In this exemplary embodiment as seen in the figure, the first metal plate 130 is integral with the first metal lines 120.

The second metal lines 140 extend from the outer periphery of the active region 160 into the active region 160 and toward the first edge 160a of the active region 160. The second metal plate 150 cooperates with the second metal lines 140 to form a generally U-shaped cross section, interconnects sidewalls of the second metal lines 140, and is disposed at the outer periphery of the active region 160. In this exemplary embodiment, the second metal plate 150 is integral with the second metal lines 140.

In this exemplary embodiment, as illustrated in FIG. 1B, the first metal plate 130 and the active region 160 define a distance D1 therebetween of about 0 μm to about 10 μm, the second metal plate 150 and the active region 160 define a distance D2 therebetween of about 0 μm to about 10 inn, and the first and second metal lines 120, 140 and the first and second metal plates 130, 150 have substantially the same thickness T. In another exemplary embodiment (not shown), the first and second metal plates 130, 150 have a thickness different from that of the first and second metal lines 120, 140.

In this exemplary embodiment, as illustrated in FIG. 1A, the first and second metal lines 120, 140 have substantially the same length L1, L2 and width W1, W2 and the first and second metal plates 130, 150 have substantially the same length L3, L4. In another exemplary embodiment, the first metal lines 120 have a length L1 different from a length L2 of the second metal lines 140. In another exemplary embodiment, the first metal lines 120 have a width W1 different from a width W2 of the second metal lines 140. In another exemplary embodiment, the first metal plate 130 has a length L3 different from a length L4 of the second metal plate 150.

FIG. 2A is a schematic sectional top view of the second exemplary semiconductor device in accordance with some embodiments and FIG. 2B is a schematic sectional view taken along line 2B-2B of FIG. 2A in accordance with some embodiments. As illustrated in FIG. 2B, the semiconductor device includes a substrate 210 and a plurality of metallization layers M5-M10.

The substrate 210 has an active region 260. In an exemplary embodiment, as best shown in FIG. 2A, the active region 260 is generally rectangular, and includes a first edge 260a, and a second edge 260b opposite to the first edge 260a in a direction transverse to a longitudinal direction thereof.

The metallization layers M5-M10 are disposed sequentially from bottom to top above the substrate 210. Since the constructions of the metallization layers M5-M10 are substantially the same, only the metallization layer M10 will be described hereinafter.

As best shown in FIG. 2A, the metallization layer M10 includes a pair of first metal lines 220, a first metal plate 230, a pair of second metal lines 240, and a second metal plate 250. The first metal lines 220 and the second metal lines 240 are substantially parallel to each other and are arranged alternately along the length of the active region 260.

The first metal lines 220 extend from an outer periphery of the active region 260 into the active region 260 and toward the second edge 260b of the active region 260. The first metal plate 230 cooperates with the first metal lines 220 to form a generally U-shaped cross section, interconnects sidewalls of the first metal lines 220, and is disposed at the outer periphery of the active region 260. In this exemplary embodiment, the first metal plate 230 is integral with the first metal lines 220.

The second metal lines 240 extend from the outer periphery of the active region 260 into the active region 260 and toward the first edge 260a of the active region 260. The second metal plate 250 cooperates with the second metal lines 240 to form a generally U-shaped cross section, interconnects sidewalls of the second metal lines 240, and extends from the outer periphery of the active region 260 into the active region 260, e.g., to an inner periphery of the active region 260. In this exemplary embodiment, the second metal plate 250 is integral with the second metal lines 240.

In this exemplary embodiment, as illustrated in FIG. 2B, the first metal plate 230 and the active region 260 define a distance D therebetween of about 0 μm to about 10 μm and the first and second metal lines 220, 240 and the first and second metal plates 230, 250 have substantially the same thickness T. In another exemplary embodiment, the first and second metal plates 230, 250 have a thickness different from that of the first and second metal lines 220, 240.

In this exemplary embodiment, as illustrated in FIG. 2A, the first metal lines 220 have a length L1 shorter than a length L2 of the second metal lines 240, the first and second metal lines 220, 240 have substantially the same width W1, W2, and the first metal plate 230 has a length L3 shorter than a length L4 of the second metal plate 250. In another exemplary embodiment, the first and second metal lines 220, 240 have substantially the same length L1, L2. In another exemplary embodiment, the first metal lines 220 have a length L1 longer than a length L2 of the second metal lines 240. In another exemplary embodiment, the first metal lines 220 have a width W1 different from a width W2 of the second metal lines 240. In another exemplary embodiment, the first and second metal plates 230, 250 have substantially the same length L3, L4. In another exemplary embodiment, the first metal plate 230 has a length L3 longer than a length L4 of the second metal plate 250.

FIG. 3A is a schematic sectional top view of the third exemplary semiconductor device in accordance with some embodiments and FIG. 3B is a schematic sectional view taken along line 3B-3B of FIG. 3A in accordance with some embodiments. As illustrated in FIG. 3B, the semiconductor device includes a substrate 310 and a plurality of metallization layers M5-M10.

The substrate 310 has an active region 360. In an exemplary embodiment, as best shown in FIG. 3A, the active region 360 is generally rectangular, and includes a first edge 360a, and a second edge 360b opposite to the first edge 360a in a direction transverse to a longitudinal direction thereof.

The metallization layers M5-M10 are disposed sequentially from bottom to top above the substrate 310. Since the constructions of the metallization layers M5-M10 are substantially the same, only the metallization layer M10 will be described hereinafter.

As best shown in FIG. 3A, the metallization layer M10 includes a pair of first metal lines 320, a first metal plate 330, a pair of second metal lines 340, and a second metal plate 350. The first metal lines 320 and the second metal lines 340 are substantially parallel to each other and are arranged alternately along the length of the active region 360.

The first metal lines 320 extend from an outer periphery of the active region 360 into the active region 360 and toward the second edge 360b of the active region 360. The first metal plate 330 cooperates with the first metal lines 320 to form a generally U-shaped cross section, interconnects sidewalls of the first metal lines 320, and is disposed at the outer periphery of the active region 360. In this exemplary embodiment, the first metal plate 330 is integral with the first metal lines 320.

The second metal lines 340 extend from an inner periphery of the active region 360 toward the first edge 360a of the active region 360. The second metal plate 350 cooperates with the second metal lines 340 to form a generally U-shaped cross section, interconnects sidewalls of the second metal lines 340, and is disposed at the inner periphery of the active region 360. In this exemplary embodiment, the second metal plate 350 is integral with the second metal lines 340.

In this exemplary embodiment, as illustrated in FIG. 3B, the first metal plate 330 and the active region 360 define a distance D therebetween of about 0 μm to about 10 μm and the first and second metal lines 320, 340 and the first and second metal plates 330, 350 have substantially the same thickness T. In another exemplary embodiment, the first and second metal plates 330, 350 have a thickness different from that of the first and second metal lines 320, 340.

In this exemplary embodiment, as illustrated in FIG. 3A, the first and second metal lines 320, 340 have substantially the same length L1, L2 and width W1, W2 and the first and second metal plates 330, 350 have substantially the same length L3, L4. In another exemplary embodiment, the first metal lines 320 have a length L1 different from a length L2 of the second metal lines 340. In another exemplary embodiment, the first metal lines 320 have a width W1 different from a width W2 of the second metal lines 340. In another exemplary embodiment, the first metal plate 330 has a length L3 different from a length L4 of the second metal plate 350.

Figure 4B:
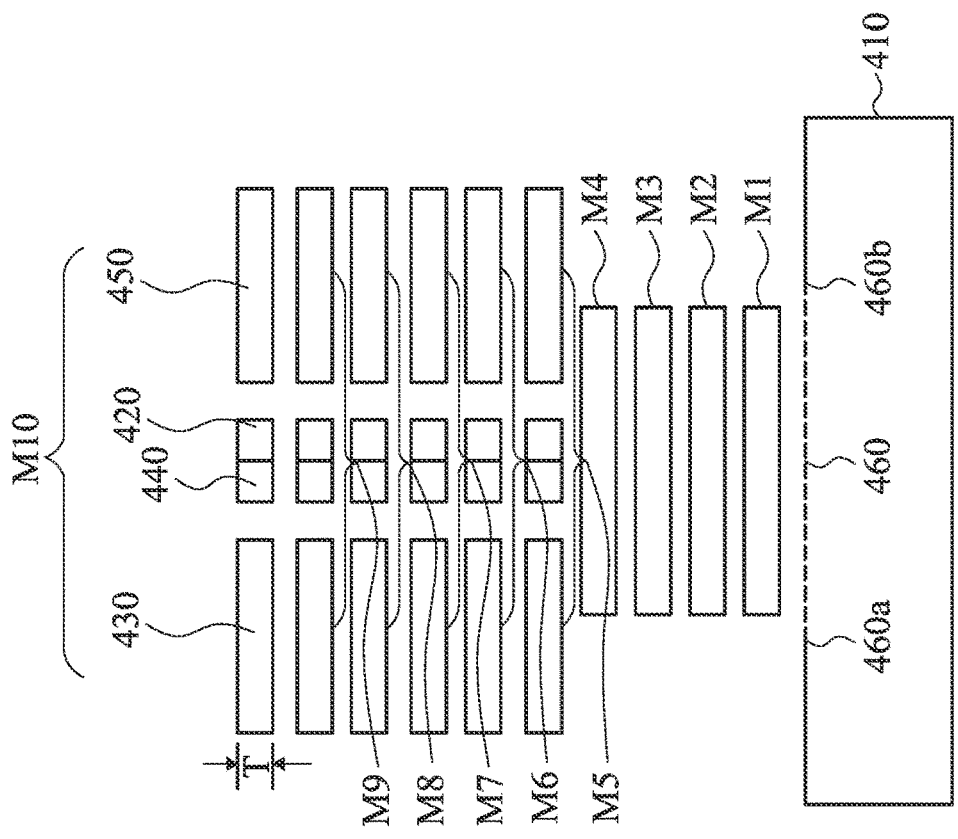
FIG. 4B is a schematic sectional view taken along line 4B-4B of FIG. 4A in accordance with some embodiments.
Figure 4A:
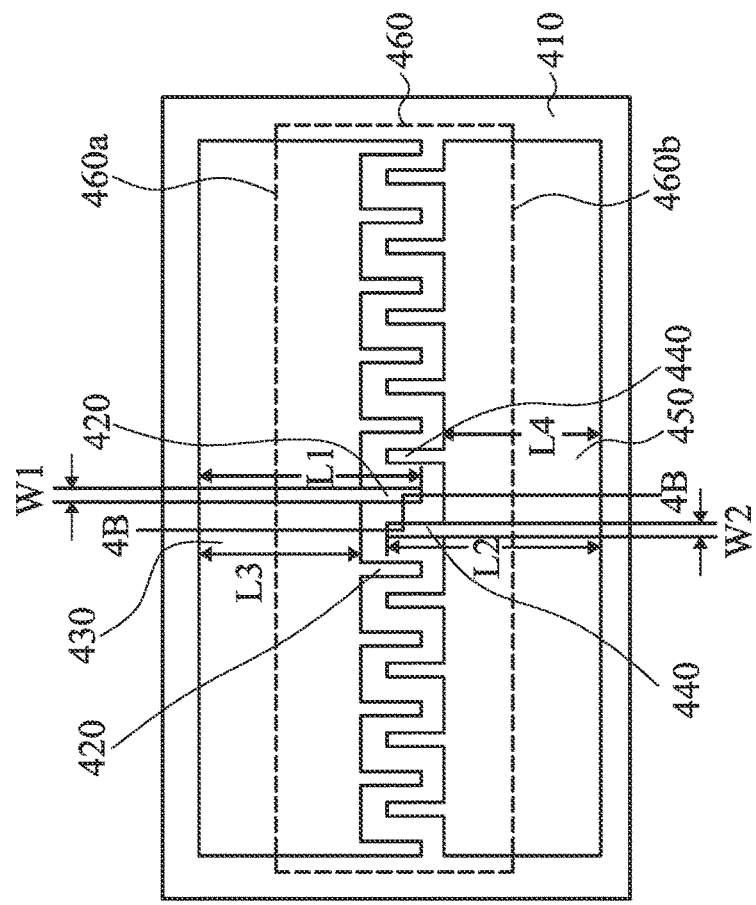
FIG. 4A is a schematic sectional top view of the fourth exemplary semiconductor device in accordance with some embodiments.

FIG. 4A is a schematic sectional top view of the fourth exemplary semiconductor device in accordance with some embodiments and FIG. 4B is a schematic sectional view taken along line 4B-4B of FIG. 4A in accordance with some embodiments. As illustrated in FIG. 4B, the semiconductor device includes a substrate 410 and a plurality of metallization layers M5-M10.

The substrate 410 has an active region 460. In an exemplary embodiment, as best shown in FIG. 4A, the active region 460 is generally rectangular, and includes a first edge 460a, and a second edge 460b opposite to the first edge 460a in a direction transverse to a longitudinal direction thereof.

The metallization layers M5-M10 are disposed sequentially from bottom to top above the substrate 410. Since the constructions of the metallization layers M5-M10 are substantially the same, only the metallization layer M10 will be described hereinafter.

As best shown in FIG. 4A, the metallization layer M10 includes a pair of first metal lines 420, a first metal plate 430, a pair of second metal lines 440, and a second metal plate 450. The first metal lines 420 and the second metal lines 440 are substantially parallel to each other and are arranged alternately along the length of the active region 460.

The first metal lines 420 extend from an outer periphery of the active region 460 into the active region 460 and toward the second edge 460b of the active region 460. The first metal plate 430 cooperates with the first metal lines 420 to form a generally U-shaped cross section, interconnects sidewalls of the first metal lines 420, and extends from the outer periphery of the active region 460 into the active region 460, e.g., to an inner periphery of the active region 460. In this exemplary embodiment, the first metal plate 430 is integral with the first metal lines 420.

The second metal lines 440 extend from the outer periphery of the active region 460 into the active region 460 and toward the first edge 460a of the active region 460. The second metal plate 450 cooperates with the second metal lines 440 to form a generally U-shaped cross section, interconnects sidewalls of the second metal lines 440, and extends from the outer periphery of the active region 460 into the active region 460, e.g., to the inner periphery of the active region 460. In this exemplary embodiment, the second metal plate 450 is integral with the second metal lines 440.

In this exemplary embodiment, as illustrated in FIG. 4B, the first and second metal lines 420, 440 and the first and second metal plates 430, 450 have substantially the same thickness T. In another exemplary embodiment, the first and second metal plates 430, 450 have a thickness different from that of the first and second metal lines 420, 440.

In this exemplary embodiment, as illustrated in FIG. 4A, the first and second metal lines 420, 440 have substantially the same length L1, L2 and width W1, W2 and the first and second metal plates 430, 450 have substantially the same length L3, L4. In another exemplary embodiment, the first metal lines 420 have a length L1 different from a length L2 of the second metal lines 440. In another exemplary embodiment, the first metal lines 420 have a width W1 different from a width W2 of the second metal lines 440. In another exemplary embodiment, the first metal plate 430 has a length L3 different from a length L4 of the second metal plate 450.

Figures 5A, 5B:
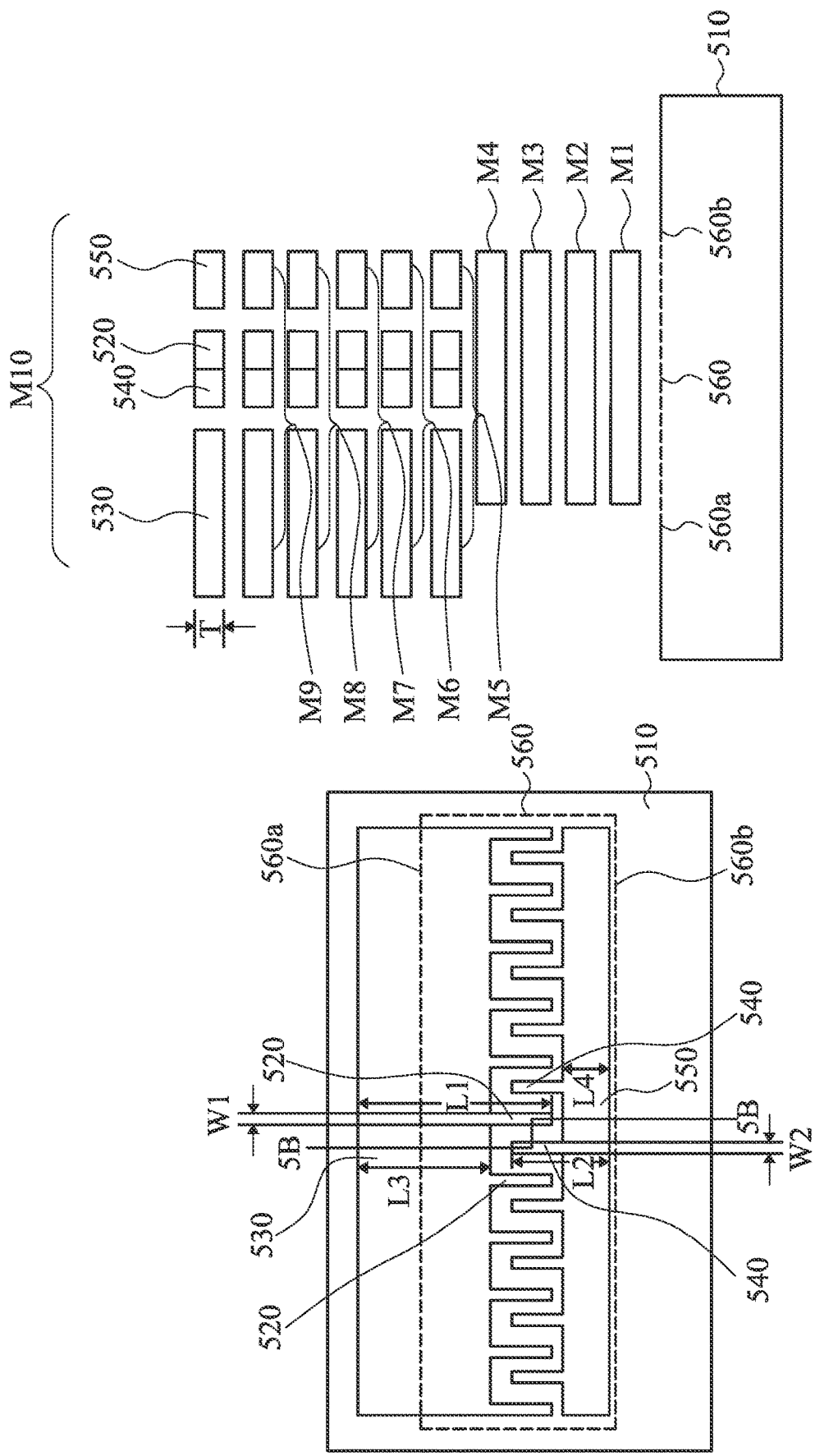
FIG. 5A is a schematic sectional top view of the fifth exemplary semiconductor device in accordance with some embodiments.
FIG. 5B is a schematic sectional view taken along line 5B-5B of FIG. 5A in accordance with some embodiments.

FIG. 5A is a schematic sectional top view of the fifth exemplary semiconductor device in accordance with some embodiments and FIG. 5B is a schematic sectional view taken along line 5B-5B of FIG. 5A in accordance with some embodiments. As illustrated in FIG. 5B, the semiconductor device includes a substrate 510 and a plurality of metallization layers M5-M10.

The substrate 510 has an active region 560. In an exemplary embodiment, as best shown in FIG. 5A, the active region 560 is generally rectangular, and includes a first edge 560a, and a second edge 560b opposite to the first edge 560a in a direction transverse to a longitudinal direction thereof.

The metallization layers M5-M10 are disposed sequentially from bottom to top above the substrate 510. Since the constructions of the metallization layers M5-M10 are substantially the same, only the metallization layer M10 will be described hereinafter.

As best shown in FIG. 5A, the metallization layer M10 includes a pair of first metal lines 520, a first metal plate 530, a pair of second metal lines 540, and a second metal plate 550. The first metal lines 520 and the second metal lines 540 are substantially parallel to each other and are arranged alternately along the length of the active region 560.

The first metal lines 520 extend from an outer periphery of the active region 560 into the active region 560 and toward the second edge 560*b* of the active region 560. The first metal plate 530 cooperates with the first metal lines 520 to form a generally U-shaped cross section, interconnects sidewalls of the first metal lines 520, and extends from the outer periphery of the active region 560 into the active region 560, e.g., to an inner periphery of the active region 560. In this exemplary embodiment, the first metal plate 530 is integral with the first metal lines 520.

The second metal lines 540 extend from the inner periphery of the active region 560 toward the first edge 560*a* of the active region 560. The second metal plate 550 cooperates with the second metal lines 540 to form a generally U-shaped cross section, interconnects sidewalls of the second metal lines 540, and is disposed at the inner periphery of the active region 560. In this exemplary embodiment, the second metal plate 550 is integral with the second metal lines 540.

In this exemplary embodiment, as illustrated in FIG. 5B, the first and second metal lines 520, 540 and the first and second metal plates 530, 550 have substantially the same thickness T. In another exemplary embodiment, the first and second metal plates 530, 550 have a thickness different from that of the first and second metal lines 520, 540.

In this exemplary embodiment, as illustrated in FIG. 5A, the first metal lines 520 have a length L1 longer than a length L2 of the second metal lines 540, the first and second metal lines 520, 540 have substantially the same width W1, W2, and the first metal plate 530 has a length L3 longer than a length L4 of the second metal plate 550. In another exemplary embodiment, the first and second metal lines 520, 540 have substantially the same length L1, L2. In another exemplary embodiment, the first metal lines 520 have a length L1 shorter than a length L2 of the second metal lines 540. In another exemplary embodiment, the first metal lines 520 have a width W1 different from a width W2 of the second metal lines 540. In another exemplary embodiment, the first and second metal plates 530, 550 have substantially the same length L3, L4. In another exemplary embodiment, the first metal plate 530 has a length L3 shorter than a length L4 of the second metal plate 550.

Figure 6B:
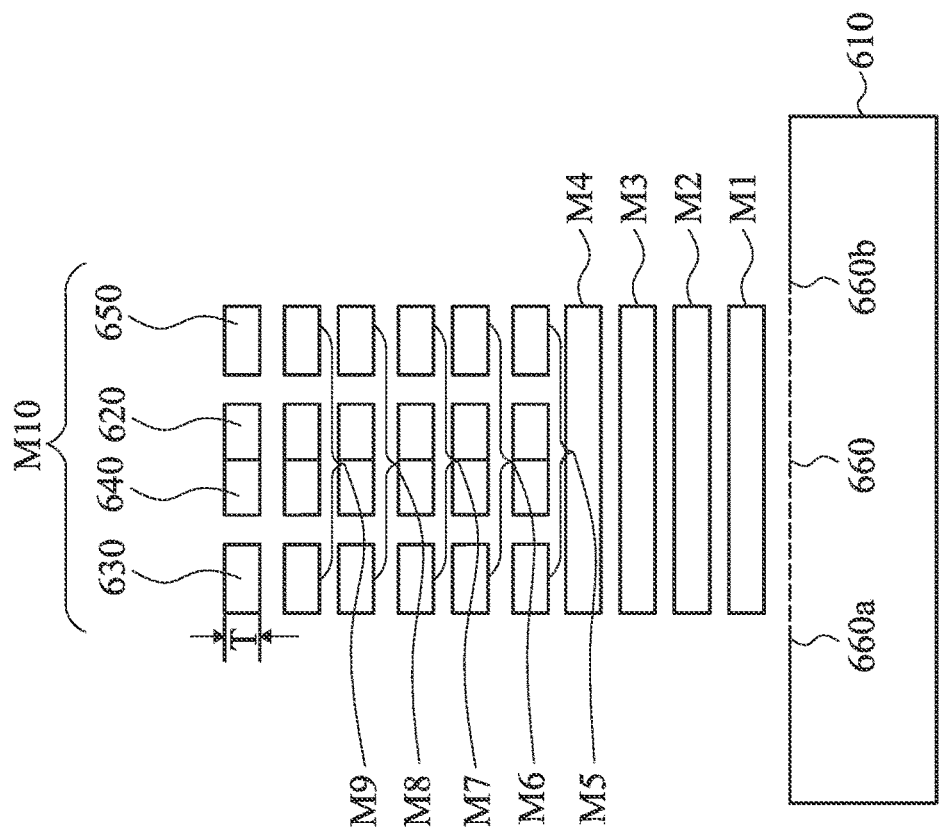
FIG. 6B is a schematic sectional view taken along line 6B-6B of FIG. 6A in accordance with some embodiments.
Figure 6A:
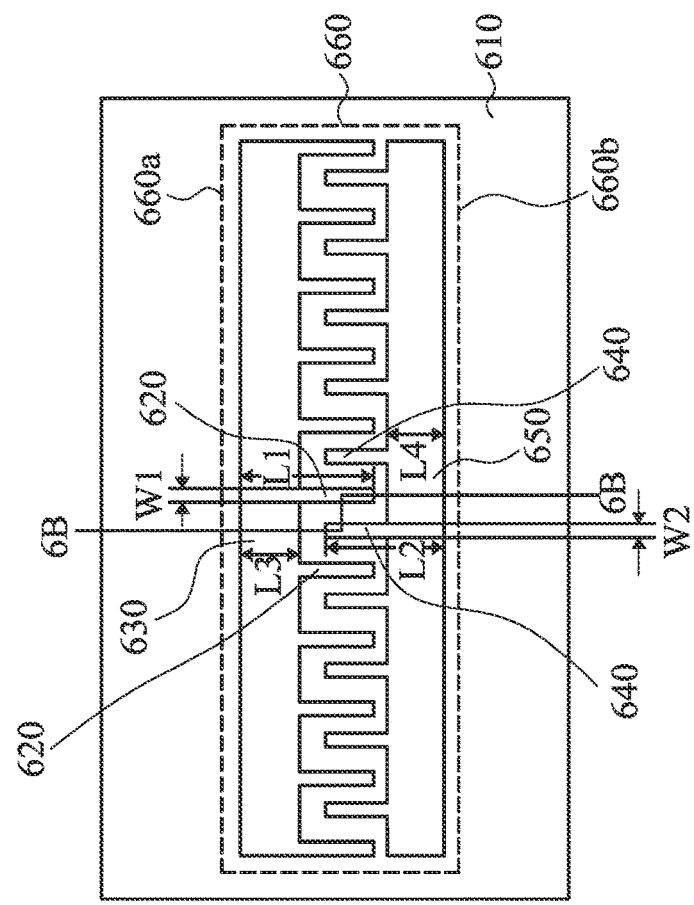
FIG. 6A is a schematic sectional top view of the sixth exemplary semiconductor device in accordance with some embodiments.

FIG. 6A is a schematic sectional top view of the sixth exemplary semiconductor device in accordance with some embodiments and FIG. 6B is a schematic sectional view taken along line 6B-6B of FIG. 6A in accordance with some embodiments. As illustrated in FIG. 6B, the semiconductor device includes a substrate 610 and a plurality of metallization layers M5-M10.

The substrate 610 has an active region 660. In an exemplary embodiment, as best shown in FIG. 6A, the active region 660 is generally rectangular, and includes a first edge 660*a*, and a second edge 660*b* opposite to the first edge 660*a* in a direction transverse to a longitudinal direction thereof.

The metallization layers M5-M10 are disposed sequentially from bottom to top above the substrate 610. Since the constructions of the metallization layers M5-M10 are substantially the same, only the metallization layer M10 will be described hereinafter.

As best shown in FIG. 6A, the metallization layer M10 includes a pair of first metal lines 620, a first metal plate 630, a pair of second metal lines 640, and a second metal plate 650. The first metal lines 620 and the second metal lines 640 are substantially parallel to each other and are arranged alternately along the length of the active region 660.

The first metal lines 620 extend from an inner periphery of the active region 660 toward the second edge 660*b* of the active region 660. The first metal plate 630 cooperates with the first metal lines 620 to form a generally U-shaped cross section, interconnects sidewalls of the first metal lines 620, and is disposed at the inner periphery of the active region 660. In this exemplary embodiment, the first metal plate 630 is integral with the first metal lines 620.

The second metal lines 640 extend from the inner periphery of the active region 660 toward the first edge 660*a* of the active region 660. The second metal plate 650 cooperates with the second metal lines 640 to form a generally U-shaped cross section, interconnects sidewalls of the second metal lines 640, and is disposed at the inner periphery of the active region 660. In this exemplary embodiment, the second metal plate 650 is integral with the second metal lines 640.

In this exemplary embodiment, as illustrated in FIG. 6B, the first and second metal lines 620, 640 and the first and second metal plates 630, 650 have substantially the same thickness T. In another exemplary embodiment, the first and second metal plates 630, 650 have a thickness different from that of the first and second metal lines 620, 640.

In this exemplary embodiment, as illustrated in FIG. 6A, the first and second metal lines 620, 640 have substantially the same length L1, L2 and width W1, W2 and the first and second metal plates 630, 650 have substantially the same length L3, L4. In another exemplary embodiment, the first metal lines 620 have a length L1 different from a length L2 of the second metal lines 640. In another exemplary embodiment, the first metal lines 620 have a width W1 different from a width W2 of the second metal lines 640. In another exemplary embodiment, the first metal plate 630 has a length L3 different from a length L4 of the second metal plate 650.

Figure 7:
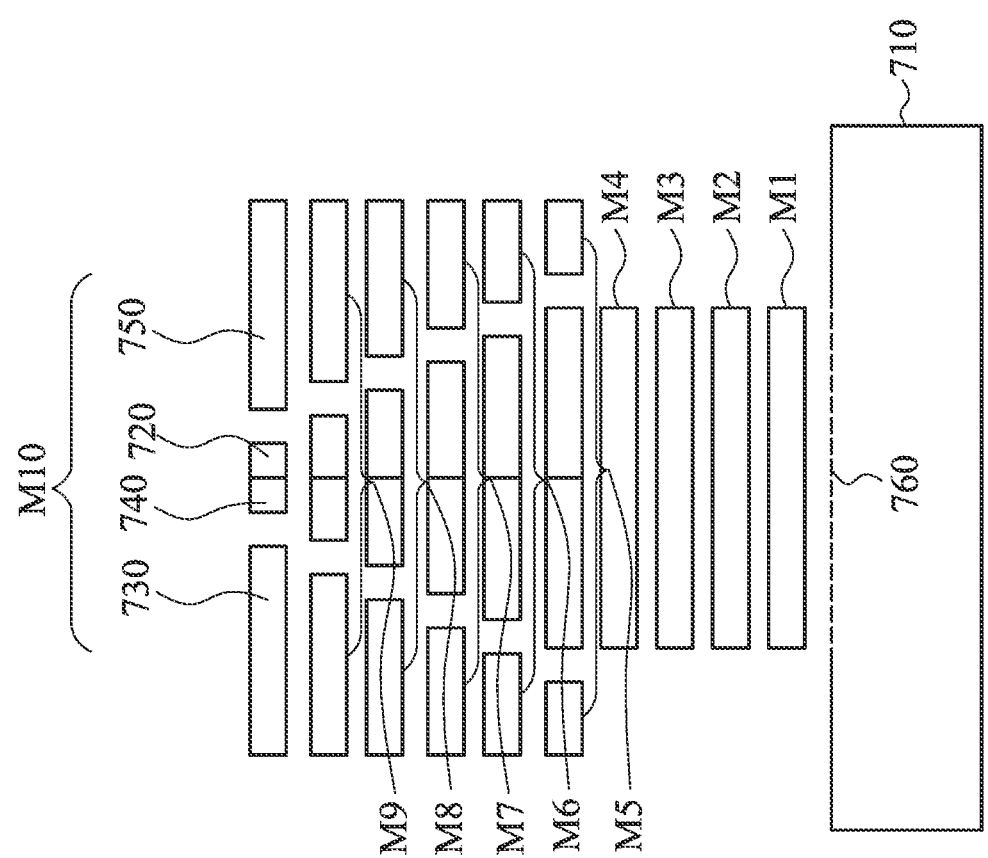
FIG. 7 is a schematic sectional side view of the seventh exemplary semiconductor device in accordance with some embodiments.

FIG. 7 is a schematic sectional side view of the seventh exemplary semiconductor device in accordance with some embodiments. As illustrated in FIG. 7, the semiconductor device includes a substrate 710 and a plurality of metallization layers M5-M10.

The metallization layers M5-M10 are disposed sequentially from bottom to top above the substrate 710. As in the exemplary embodiments described above with reference to FIGS. 1A-6A and 1B-6B, each of the metallization layers M5-M10 of this exemplary embodiment includes a pair of first metal lines 720, a first metal plate 730 that interconnects the first metal lines 720, a pair of second metal lines 740, and a second metal plate 750 that interconnects the second metal lines 740 (only the metal lines and metal plates of the metallization layer M10 are identified by reference numerals in FIG. 7).

In this exemplary embodiment, as illustrated in FIG. 7, the first metal plate 730 of an overlying metallization layer, e.g., M10, of an adjacent pair of the metallization layers, e.g., M9 and M10, has a length longer than that of the first metal plate of an underlying metallization layer, e.g., M9, of the adjacent pair of the metallization layers, e.g., M9 and M10. Also, in this exemplary embodiment, the second metal plate 750 of an overlying metallization layer, e.g., M10, of an adjacent pair of the metallization layers, e.g., M9 and M10, has a length longer than that of the second metal plate of an underlying metallization layer, e.g., M9, of the adjacent pair of the metallization layers, e.g., M9 and M10.

Figure 8:
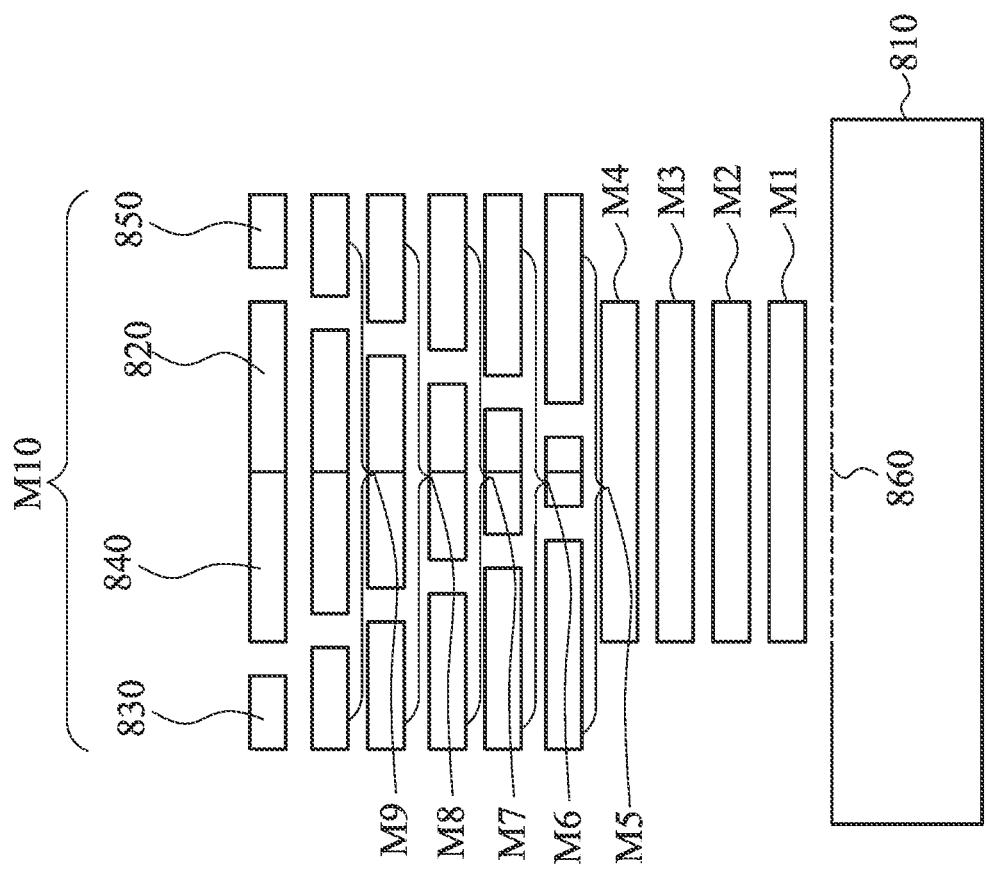
FIG. 8 is a schematic sectional side view of the eighth exemplary semiconductor device in accordance with some embodiments.

FIG. 8 is a schematic sectional side view of the eighth exemplary semiconductor device in accordance with some embodiments. As illustrated in FIG. 8, the semiconductor device includes a substrate 810 and a plurality of metallization layers M5-M10.

The metallization layers M5-M10 are disposed sequentially from bottom to top above the substrate 810. As in the exemplary embodiments described above with reference to FIGS. 1A-6A, 1B-6B, and 7, each of the metallization layers M5-M10 of this exemplary embodiment includes a pair of first metal lines 820, a first metal plate 830 that interconnects the first metal lines 820, a pair of second metal lines 840, and a second metal plate 850 that interconnects the second metal lines 840 (only the metal lines and metal plates of the metallization layer M10 are identified by reference numerals in FIG. 8).

In this exemplary embodiment, as illustrated in FIG. 8, the first metal plate 830 of an overlying metallization layer, e.g., M10, of an adjacent pair of the metallization layers, e.g., M9 and M10, has a length shorter than that of the first metal plate of an underlying metallization layer, e.g., M9, of the adjacent pair of the metallization layers, e.g., M9 and M10. Also, in this exemplary embodiment, the second metal plate 850 of an overlying metallization layer, e.g., M10, of an adjacent pair of the metallization layers, e.g., M9 and M10, has a length shorter than that of the second metal plate of an underlying metallization layer, e.g., M9, of the adjacent pair of the metallization layers, e.g., M9 and M10.

In the exemplary embodiments described above with reference to FIGS. 1A-6A, 1B-6B, 7, and 8, the semiconductor device further includes a plurality of diodes (not shown), a plurality of second metallization layers M1-M4, a plurality of third metallization layers (not shown), and a dielectric layer (not shown).

The diodes are disposed in the active region. In this exemplary embodiment, one of the first metal line 120, 220, 320, 420, 520, 620, 720, 820 and the second metal line 140, 240, 340, 440, 540, 640, 740, 840 serves as anodes of the diodes, and the other of the first metal line 120, 220, 320, 420, 520, 620, 720, 820 and the second metal line 140, 240, 340, 440, 540, 640, 740, 840 serves as cathodes of the diodes. In another exemplary embodiment, the semiconductor device further includes transistors, another active component, capacitors, resistors, inductors, another passive component, or a combination thereof.

In the exemplary embodiments described above with reference to FIGS. 1A-6A, 1B-6B, 7, and 8, the first and second metal lines 120, 220, 320, 420, 520, 620, 720, 820, 140, 240, 340, 440, 540, 640, 740, 840 and the first and second metal plates 130, 230, 330, 430, 530, 630, 730, 830, 150, 250, 350, 450, 550, 650, 750, 850 of the metallization layers M5-M10 serve as horizontal interconnects.

The second metallization layers M1-M4 are disposed sequentially from bottom to top between the substrate 110, 210, 310, 410, 510, 610, 710, 810 and the metallization layer M5. Each of the second metallization layers M1-M4 includes a plurality of metal lines that are parallel to each other, that are arranged along the length of the active region 160, 260, 360, 460, 560, 660, 760, 860, and that serve as horizontal interconnects.

Each of the third metallization layers is disposed between an adjacent pair of the metallization layers M1-M10 and includes at least one vertical interconnect, i.e., via.

The dielectric layer surrounds the diodes, the metallization layers M5-M10, the second metallization layers M1-M4, and the third metallization layers.

Figure 9:
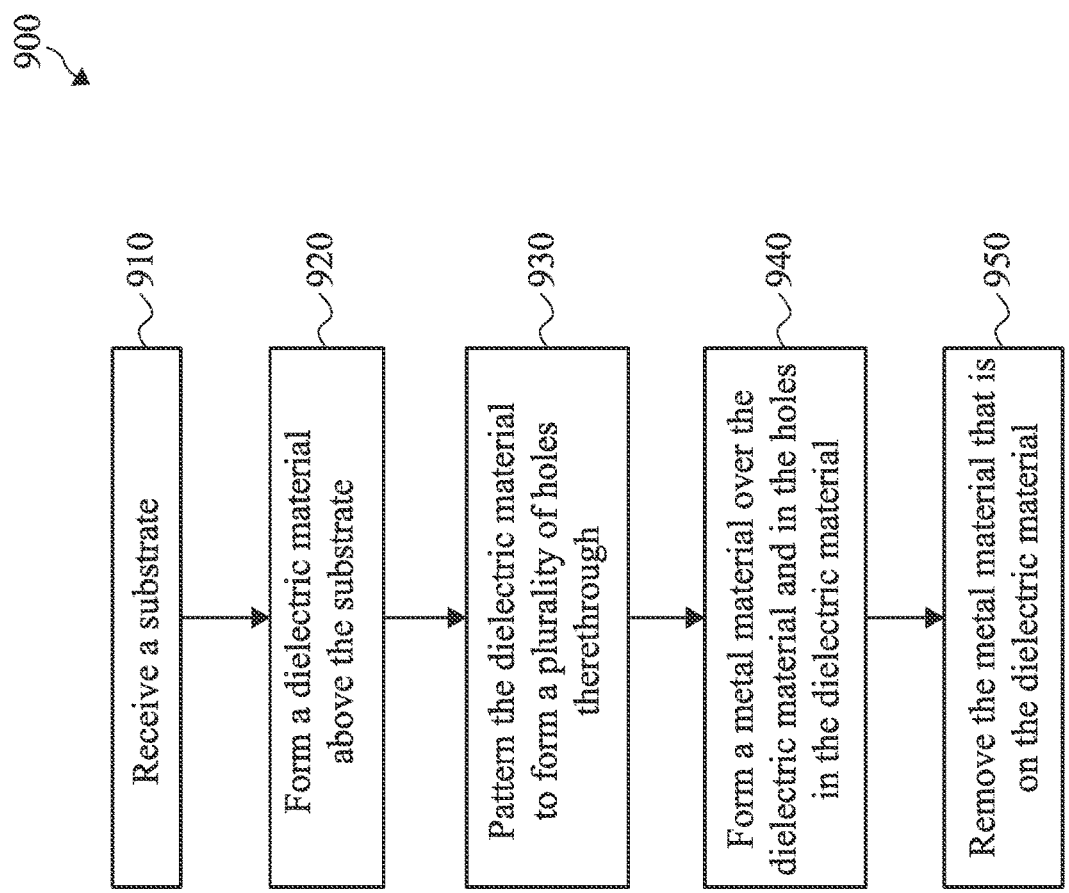
FIG. 9 is a flowchart illustrating an exemplary method of fabricating a semiconductor device in accordance with some embodiments.

FIG. 9 is a flowchart illustrating a method 900 of fabricating a semiconductor device in accordance with some embodiments. It is understood that additional operations may be performed before, during, and/or after the method 900 and that some other process may only be briefly described herein.

As illustrated in FIG. 9, the method 900 begins with operation 910 in which a substrate is received. The substrate has an active region that includes opposite first and second edges. In some embodiments, the substrate is a bulk substrate. Examples of materials for the bulk substrate include, but are not limited to, Si, Ge, another semiconductor material, and an alloy thereof. In some embodiments, the substrate is a semiconductor-on-insulator (SOI) substrate. The method 900 continues with operation 920 in which a dielectric material is formed above the substrate. Examples of dielectric materials include, but are not limited to, SiO, SiN, SiON, SiC, SiOC, phosphosilicate glass (PSG), borophosphosilicate glass (BPSG), and the like. The dielectric material is formed using chemical vapor deposition (CVD), spin-on, sputtering, or other suitable deposition processes. The method 900 continues with operation 930 in which the dielectric material is patterned, e.g., using lithographic and etching processes, to form a plurality of holes therethrough. The method 900 continues with operation 940 in which a metal material is formed over the dielectric material and in the holes in the dielectric material. Examples of metal materials include, but are not limited to, W, Ni, Ti, Mo, Ta, Cu, Pt, Ag, Au, Ru, Jr, Rh, Re, another metal material, an alloy of metal material and semiconductor material, and a combination thereof. The method 900 continues with operation 950 in which the metal material that is on the dielectric material is removed. The metal material that is in the holes in the dielectric material serves as a metallization layer, e.g., the metallization layer M10 of FIG. 1A-6A, 1B-6B, 7, or 8.

In some embodiments, the method 900 further includes the operations of: forming a second dielectric material above the substrate; patterning the second dielectric material to form a plurality of holes therethrough; forming a second metal material over the second dielectric material and in the holes in the second dielectric material; and removing the second metal material that is on the second dielectric material. The second metal material that is in the holes in the second dielectric material serves another metallization layer, e.g., the metallization layer M9 of FIG. 1A-6A, 1B-6B, 7, or 8.

In some embodiments, the method 900 further includes the operations of: forming a third dielectric material above the substrate; patterning the third dielectric material to form a plurality of holes therethrough; forming a third metal material over the third dielectric layer and in the holes in third dielectric layer; and removing the third metal material that is on the third dielectric layer. The third metal material that is in the holes in the third dielectric material serves another metallization layer, e.g., the metallization layer M1 of FIG. 1A-6A, 1B-6B, 7, or 8.

Based on experimental results, when an ESD surge is applied to the conventional semiconductor device, current density of current flowing through the metallization layer thereof and temperatures of the metallization layer and the substrate thereof are approximately 3.9E7 A/cm$^2$, 127° C., and 77° C., respectively, whereas when an ESD surge is applied to the semiconductor device of the present disclosure, current density of current flowing through the metallization layer thereof and temperatures of the metallization layer and the substrate thereof are approximately 2.9E6 A/cm$^2$, 65° C., and 62° C., respectively. The structures of the metallization layers of the semiconductor device of the present disclosure are capable of providing protection for the components of the semiconductor device from ESD surges.

Those skilled in the art will readily appreciate that, after reading this disclosure, the structure of the metallization layer described in an exemplary embodiment may be combined with that in another exemplary embodiment. For example, in a further exemplary embodiment, the first/ second metal plates of some of the metallization layers may have substantially the same length, as in the first-sixth exemplary embodiments, while the first/second metal plates of the other of the metallization layers may have different lengths, as in the seventh and eighth exemplary embodiments. As another example, in another further exemplary embodiment, the first and second metal plates of some of the metallization layers may be disposed at the outer periphery of the active region, as in the first exemplary embodiment, while the first and second metal plates of the other of the metallization layers may be disposed at the inner periphery of the active region, as in the sixth exemplary embodiment.

In an exemplary embodiment of a semiconductor device, the semiconductor device comprises a substrate and a metallization layer. The substrate has an active region that includes opposite first and second edges. The metallization layer is disposed above the substrate, and includes a pair of metal lines that extend from an outer periphery of the active region into the active region and toward the second edge of the active region, and a metal plate that interconnects the metal lines, wherein at least a portion of the metal plate is disposed at the outer periphery of the active region.

In another exemplary embodiment of a semiconductor device, the semiconductor device comprises a substrate and a metallization layer. The substrate has an active region that includes opposite first and second edges. The metallization layer is disposed above the substrate, and includes a pair of metal lines that extend from an inner periphery of the active region toward the second edge of the active region, and a metal plate that interconnects the metal lines and that is disposed at the inner periphery of the active region.

In an exemplary embodiment of a method of fabricating a semiconductor device, the method comprises: receiving a substrate having an active region that includes opposite first and second edges; forming a dielectric material above the substrate; patterning the dielectric material to form a plurality of holes therethrough; forming a metal material over the dielectric material and in the holes in the dielectric material; and removing the metal material that is on the dielectric material, wherein the metal material that is in the holes includes a pair of metal lines that extend toward the second edge of the active region, and a metal plate that interconnects the metal lines and that is disposed at at least one of outer and inner peripheries of the active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   forming a dielectric material above a substrate having an active region that includes opposite first and second edges;
   patterning the dielectric material;
   depositing a metal material in holes in the patterned dielectric material, wherein the metal material includes:
     a plurality of first metal lines that extend toward the second edge of the active region;
     a first metal plate that interconnects the first metal lines and that has at least a portion outside the active region;
     a plurality of second metal lines that extend toward the first edge of the active region; and
     a second metal plate that interconnects the second metal lines; and
   forming a third metal plate that overlaps the first metal plate, wherein the third metal plate has a different length than the first metal plate, the first metal plate has opposite first and second ends, the third metal plate has opposite first and second ends, the first ends of the first and third metal plates are inside the active region, the second ends of the first and third metal plates are outside the active region and align with each other along a direction perpendicular to the metal plates, and the first end of the first metal plate is at a position underneath an intermediate portion between the first and second ends of the third metal plate.

2. The method of claim 1, wherein the second metal plate is outside the active region.

3. The method of claim 1, wherein the second metal plate is inside and outside the active region.

4. The method of claim 1, wherein the second metal plate is inside the active region.

5. The method of claim 1, further comprising:
   forming a fourth metal plate that overlaps the second metal plate, wherein the fourth metal plate has a different length than that of the second metal plate.

6. The method of claim 5, wherein the fourth metal plate is inside and outside the active region.

7. A method of fabricating a semiconductor device, the method comprising:
   forming a dielectric material above a substrate having an active region that includes opposite first and second edges;
   patterning the dielectric material;
   depositing a metal material in holes in the patterned dielectric material, wherein the metal material includes:
     a plurality of first metal lines, each of which has a first end portion outside the active region, a second end portion inside the active region, and an intermediate portion that extends through the first edge of the active region;
     a first metal plate that interconnects the first end portions of the first metal lines;
     a plurality of second metal lines that extend toward the first edge of the active region; and
     a second metal plate that interconnects the second metal lines; and
   forming a third metal plate that overlaps the first metal plate, wherein the third metal plate has a different length than the first metal plate, the first metal plate has opposite first and second ends, the third metal plate has opposite first and second ends, the first ends of the first and third metal plates are inside the active region, the second ends of the first and third metal plates are outside the active region and align with each other along a direction perpendicular to the metal plates, and the first end of the first metal plate is at a position underneath an intermediate portion between the first and second ends of the third metal plate.

8. The method of claim 7, wherein the second metal plate is outside the active region.

9. The method of claim 7, wherein the second metal plate is inside and outside the active region.

10. The method of claim 7, wherein the second metal plate is inside the active region.

11. A system comprising:
means for forming a dielectric material above a substrate having an active region that includes opposite first and second edges and a centerline substantially parallel to the first and second edges;
means for patterning the dielectric material;
means for depositing a first metal material of a first metallization layer in holes in the patterned dielectric material, wherein the first metal material includes:
a plurality of first metal lines, each of which extends through the centerline;
a first metal plate that interconnects the first metal lines;
a plurality of second metal lines, each of which extends toward the first edge of the active region; and
a second metal plate that interconnects the second metal lines;
wherein the means for depositing are further configured to deposit a third metal plate that overlaps the first metal plate, and wherein the third metal plate has a different length than that of the first metal plate, the first metal plate has opposite first and second ends, the third metal plate has opposite first and second ends, the first ends of the first and third metal plates are inside the active region, the second ends of the first and third metal plates are outside the active region and align with each other along a direction perpendicular to the metal plates, and the first end of the first metal plate is at a position underneath an intermediate portion between the first and second ends of the third metal plate.

12. The system of claim 11, wherein the means for depositing are further configured to deposit a second metal material of a second metallization layer, the second metallization is between the substrate and the first metallization layer, and the second metal material includes a metal line that is inside the active region and that extends through the centerline.

13. The system of claim 11, wherein the second metal plate is outside the active region.

14. The system of claim 11, wherein the second metal plate is inside and outside the active region.

15. The system of claim 11, wherein the second metal plate is inside the active region.

16. The system of claim 11, wherein the second metal plate has substantially the same length as the first metal plate.

17. The system of claim 11, wherein the second metal plate has a different length than the first metal plate.

18. The system of claim 11, wherein the means for depositing are further configured to deposit a fourth metal plate that overlaps the second metal plate, and the fourth metal plate has a different length than that of the second metal plate.

19. The system of claim 18, wherein the fourth metal plate is inside and outside the active region.

20. The system of claim 18, wherein the second metal plate has opposite first and second ends, the fourth metal plate has opposite first and second ends, the first ends of the second and fourth metal plates are inside the active region, the second ends of the second and fourth metal plates are outside the active region and align with each other along the direction perpendicular to the metal plates, and the first end of the second metal plate is at a position underneath an intermediate portion between the first and second ends of the fourth metal plate.

* * * * *